United States Patent
Hathaway et al.

(10) Patent No.: US 9,785,737 B2
(45) Date of Patent: Oct. 10, 2017

(54) PARALLEL MULTI-THREADED COMMON PATH PESSIMISM REMOVAL IN MULTIPLE PATHS

(71) Applicant: International Business Machines Corporation, Armonk, NY (US)

(72) Inventors: David J. Hathaway, Underhill Center, VT (US); Kerim Kalafala, Rhinebeck, NY (US); Vasant B. Rao, Fishkill, NY (US); Alexander J. Suess, Hopewell Junction, NY (US); Vladimir Zolotov, Putnam Valley, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 28 days.

(21) Appl. No.: 14/943,097

(22) Filed: Nov. 17, 2015

(65) Prior Publication Data
US 2017/0140089 A1    May 18, 2017

(51) Int. Cl.
*G06F 17/50* (2006.01)

(52) U.S. Cl.
CPC .................. *G06F 17/5081* (2013.01)

(58) Field of Classification Search
USPC ........................................... 716/108
See application file for complete search history.

(56) References Cited

U.S. PATENT DOCUMENTS

| | | | |
|---|---|---|---|
| 7,636,905 B2 | 12/2009 | Darsow et al. | |
| 8,141,014 B2 | 3/2012 | Foreman et al. | |
| 8,185,854 B1 | 5/2012 | Hutton et al. | |
| 8,255,854 B2 | 8/2012 | Zhu et al. | |
| 8,381,150 B2 | 2/2013 | Zolotov et al. | |
| 8,468,483 B2 | 6/2013 | Buck et al. | |
| 8,578,310 B2 | 11/2013 | Kalafala et al. | |
| 8,839,167 B1 | 9/2014 | Dreibelbis et al. | |
| 8,843,864 B2 | 9/2014 | Le et al. | |
| 9,418,201 B1 * | 8/2016 | Elmendorf | G06F 17/5031 |
| 2006/0064432 A1 * | 3/2006 | Pettovello | G06F 17/30911 |
| 2008/0134117 A1 * | 6/2008 | Kalafala | G06F 17/5031 716/108 |
| 2009/0106717 A1 * | 4/2009 | Chen | G06F 17/5031 716/113 |

(Continued)

Primary Examiner — Mohammed Alam
(74) Attorney, Agent, or Firm — Cantor Colburn LLP; Steven Meyers

(57) ABSTRACT

A method, system, and computer program product to perform parallel multi-threaded common path pessimism removal in integrated circuit design include constructing, using a processor, a thread-specific graphical representation (TSGR) relating to each data node and clock node pair and performing processes in parallel for each TSGR. The processes include determining initial arrival times at the data node and the clock node, computing initial test slack based on the initial arrival times at the data node and the clock node, identifying fan-out nodes among the additional nodes, each fan-out node being an origin of at least two of the edges in the two or more paths to the clock node, generating one or more tags based the fan-out nodes, determining adjusted arrival times based on the one or more tags, and computing adjusted test slack based on the adjusted arrival times.

20 Claims, 12 Drawing Sheets

(56) References Cited

U.S. PATENT DOCUMENTS

2012/0311515 A1* 12/2012 Zolotov .................... G06F 8/20
  716/108
2015/0324514 A1* 11/2015 Teig ...................... G06F 17/505
  716/134
2016/0378637 A1* 12/2016 Gamble ................ G06F 11/362
  707/702

* cited by examiner

PARALLEL MULTI-THREADED COMMON PATH PESSIMISM REMOVAL IN MULTIPLE PATHS

BACKGROUND

The present invention relates to timing analysis in digital integrated circuit design, and more specifically, to parallel multi-threaded common path pessimism removal in multiple paths.

Timing analysis is an important aspect of digital integrated circuit (IC) or chip design and is performed at various stages to ensure that the end product will meet all timing requirements. A chip design is modeled as a timing graph with gate- and wire-pins denoted by timing nodes. Each connection from an input pin (source node) to an output pin (sink node) is denoted by a directed timing edge in the graph. Generally, timing analysis involves calculating delay through the edges or paths between a chip input and a chip output to determine the speed of propagation of the arrival time of a signal at different components (e.g., gates, wires, latches) of the chip. Generally, arrival time at a given point refers to the time at which the voltage at the point reaches half of the maximum voltage. To account for on-chip and environmental variations (e.g., temperature, battery level), statistical static timing analysis (SSTA) may be used to express arrival time as a range given by {early mode arrival time, late mode arrival time}. A variety of tests may be implemented as part of the timing analysis. For example, a setup test compares the late mode arrival time at a data input node with the early mode arrival time at an external clock input node of the same device. If the late mode arrival time of the data is earlier than the early mode arrival time of the clock signal, then the test is passed because the data can be correctly captured. The issue of pessimism arises in timing analysis tests when early mode and late mode is considered for the same edge (path). For example, in the setup test example, if the data input and clock input shared an edge (a path segment), the test uses late mode arrival time with respect to the data input, which considers late mode delay through that edge, as well as early mode arrival time with respect to the clock input, which considers early mode delay through that same edge. This is referred to as common path pessimism (CPP).

SUMMARY

Embodiments include a method, system, and computer program product for performing parallel multi-threaded common path pessimism removal in integrated circuit design. The method includes constructing, using a processor, a thread-specific graphical representation (TSGR) relating to each data node and clock node pair, each TSGR including one or more paths from a source node to the data node, two or more paths from the source node to the clock node, additional nodes between the source node and the data node or the clock node, and edges that interconnect the source node or any of the additional nodes with the data node or the clock node or the source node or any of the additional nodes with each other; performing, using the processor, in parallel, for each TSGR determining initial arrival times at the data node and the clock node; computing initial test slack based on the initial arrival times at the data node and the clock node; identifying fan-out nodes among the additional nodes, each fan-out node being an origin of at least two of the edges in the two or more paths to the clock node; generating one or more tags based the fan-out nodes; determining adjusted arrival times based on the one or more tags; and computing adjusted test slack based on the adjusted arrival times, wherein the adjusted test slack is used to validate or modify the integrated circuit design.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 3-5 illustrate processes shown in FIG. 2 for an exemplary TSGR according to an embodiment, in which:

FIG. 3 depicts the exemplary TSGR;

FIG. 4 illustrates the process of back propagating value needed flags and obtaining arrival times; and FIG. 5 illustrates the processes of adjusting delay and re-computing test slack;

FIGS. 6-9 illustrate processes shown in FIG. 2 for another exemplary TSGR according to another embodiment, in which:

FIG. 6 depicts the exemplary TSGR;

FIG. 7 illustrates the process of back propagating value needed flags and obtaining arrival times;

FIG. 8 illustrates the process of inserting tags; and

FIG. 9 illustrates the processes of adjusting delay and re-computing test slack;

FIG. 10-12 illustrate processes shown in FIG. 2 for another exemplary TSGR according to another embodiment, in which:

FIG. 10 depicts the exemplary TSGR;

FIG. 11 illustrates the process of back propagating value needed flags and obtaining arrival times; and FIG. 12 illustrates the process of inserting tags and adjusting delay to re-compute test slack.

DETAILED DESCRIPTION

As noted above, CPP arises from the assumption of both early mode delay and late mode delay through the same edge due to the edge being common to two nodes whose early mode and late mode arrival times are being considered. The pessimism leads to degraded timing analysis results. Common path pessimism removal (CPPR) refers to the process by which some timing credit is given back to an edge to account for the pessimism, and the edge delay is adjusted accordingly. Embodiments of the systems and methods detailed herein relate to parallel multi-threaded CPPR when there are multiple paths to the clock.

Figure 1:
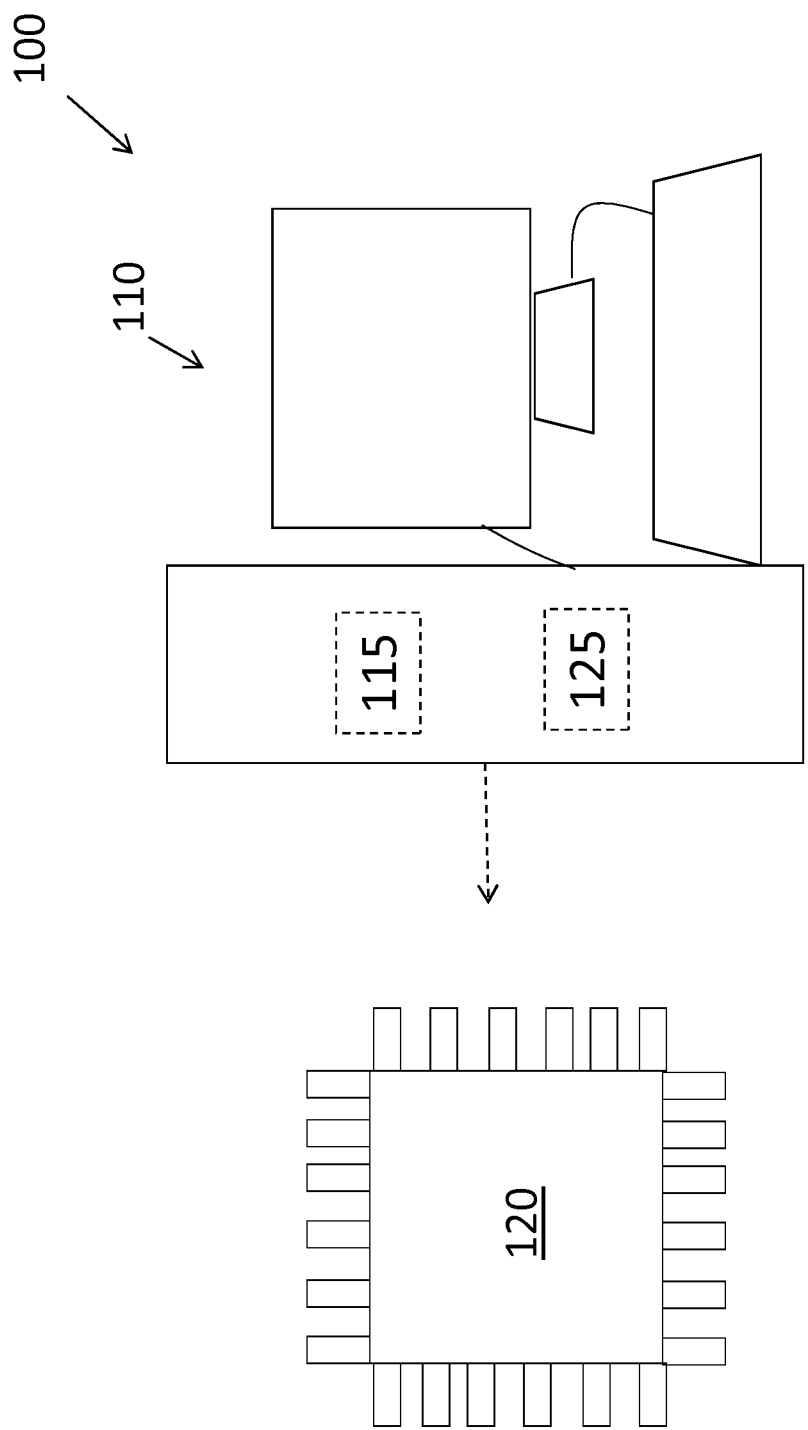
FIG. 1 is a block diagram of a system according to embodiments.

FIG. 1 is a block diagram of a system 100 according to embodiments of the invention. The system 100 includes a processing system 110 used to design an integrated circuit and the resulting physical implementation of the integrated circuit 120. The system 100 includes additional known components that perform functions such as, for example, obtaining measurements from the integrated circuit 120 that are provided to the processing system 110 as needed. The processing system 110 includes one or more memory devices 115 and one or more processors 125. Multiple of the processors 125 may be used in the parallel multi-thread CPPR detailed below. The memory device 115 stores instructions implemented by the processor 125. As further discussed below, these instructions include processes used to perform the parallel multi-threaded CPPR in multiple clock paths. According to the embodiments detailed below, the memory device 115 may additionally store the arrival time at the source node of each thread-specific graph representation (TSGR) and delay values through the edges, for example.

Figure 2:
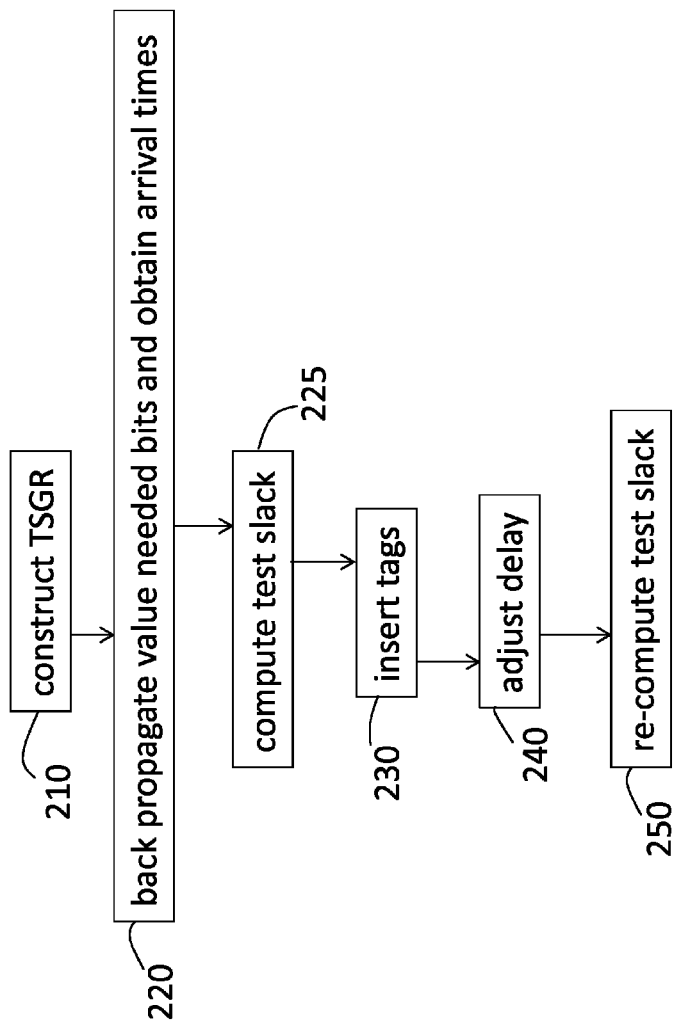
FIG. 2 is a process flow of a method of performing common path pessimism removal (CPPR) according to embodiments.

FIG. 2 is a process flow of a method of performing CPPR according to embodiments. The processes shown in FIG. 1 are further detailed with reference to the examples discussed below. At block 210, constructing a TSGR refers to isolating one computational thread from the overall directed acyclic graph used for timing analysis. Examples of a TSGR are discussed further below. By performing CPPR on thread-specific graphical representations, the nodes affecting a given computational thread are isolated such that each thread may be analyzed independently and, thus, in parallel. Back propagating value needed flags and obtaining arrival times, at block 220, includes first working backwards from the nodes of interest for the test (e.g., data input node and clock input node for a setup test) to the source node and indicating the arrival times and delay values needed. This relates to the fact that the arrival time at a given node is determined by the arrival times at preceding nodes and delays through interconnections (e.g., wires) between the preceding nodes. Forward propagating from the source node facilitates obtaining the arrival times (indicated by the value needed flags) at all other nodes. This process is further discussed with reference to FIG. 4, for example. Computing test slack, at block 225, is based on the initially determined arrival times. The remaining processes shown in FIG. 2 are only performed when the test slack determined at block 225 is less than some predefined necessary test slack. When more than one clock path is considered simultaneously, inserting tags, at block 230, is performed as discussed with reference to FIG. 8 below. The process at block 230 is optional according to alternate embodiments, because, when each path to the clock is considered individually (in a different TSGR), the tags are not needed. Adjusting the delay, at block 240, refers to adjusting delay values of edges to account for CPP. This process is further discussed with reference to FIG. 5 below, for example. Re-computing the test slack, at block 250, as further detailed below, involves forward propagating the adjusted delay values to determine new arrival times at the nodes of interest in the timing analysis test and, thereby, rerunning the test.

Figure 3:
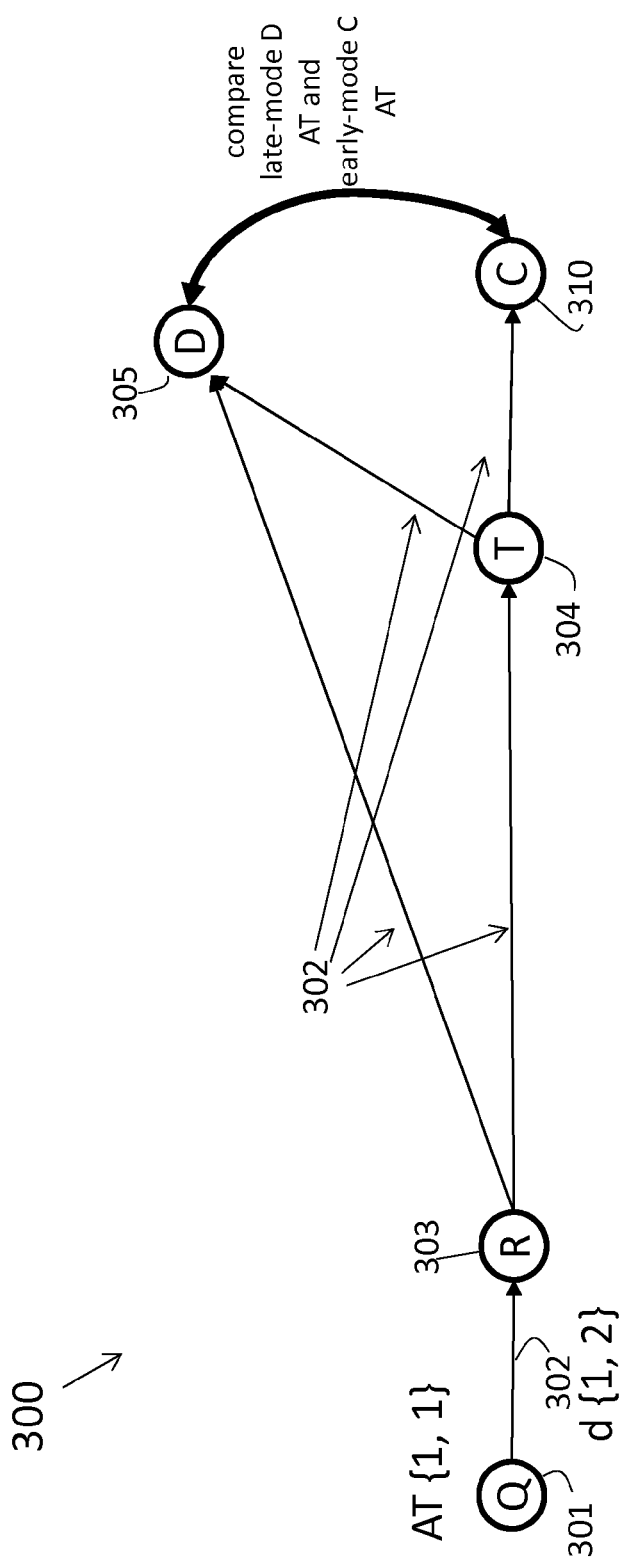
Figure 4:
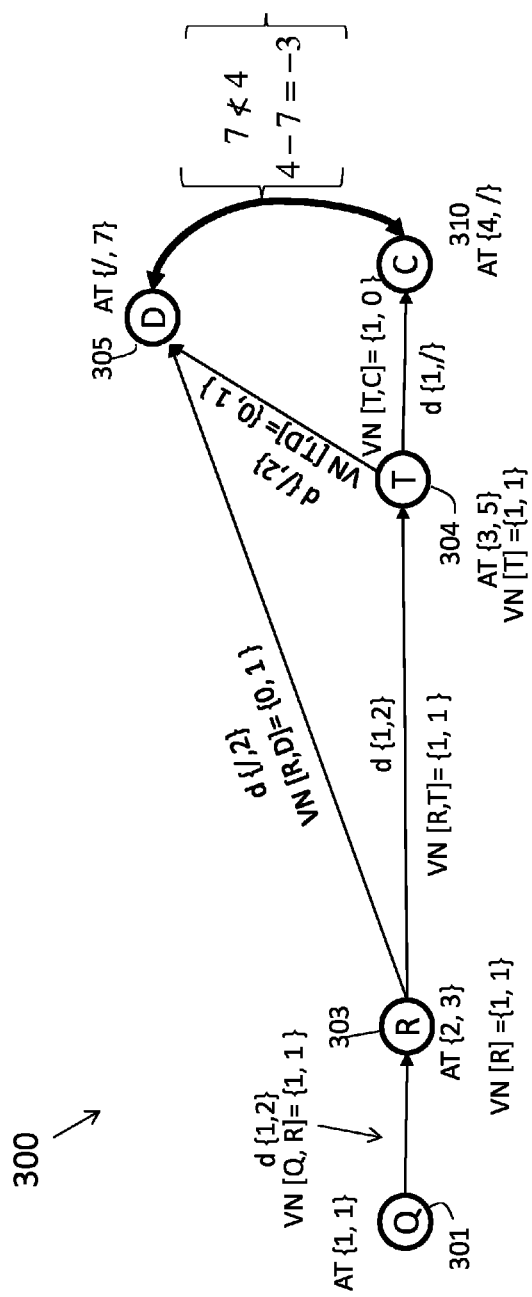
Figure 5:
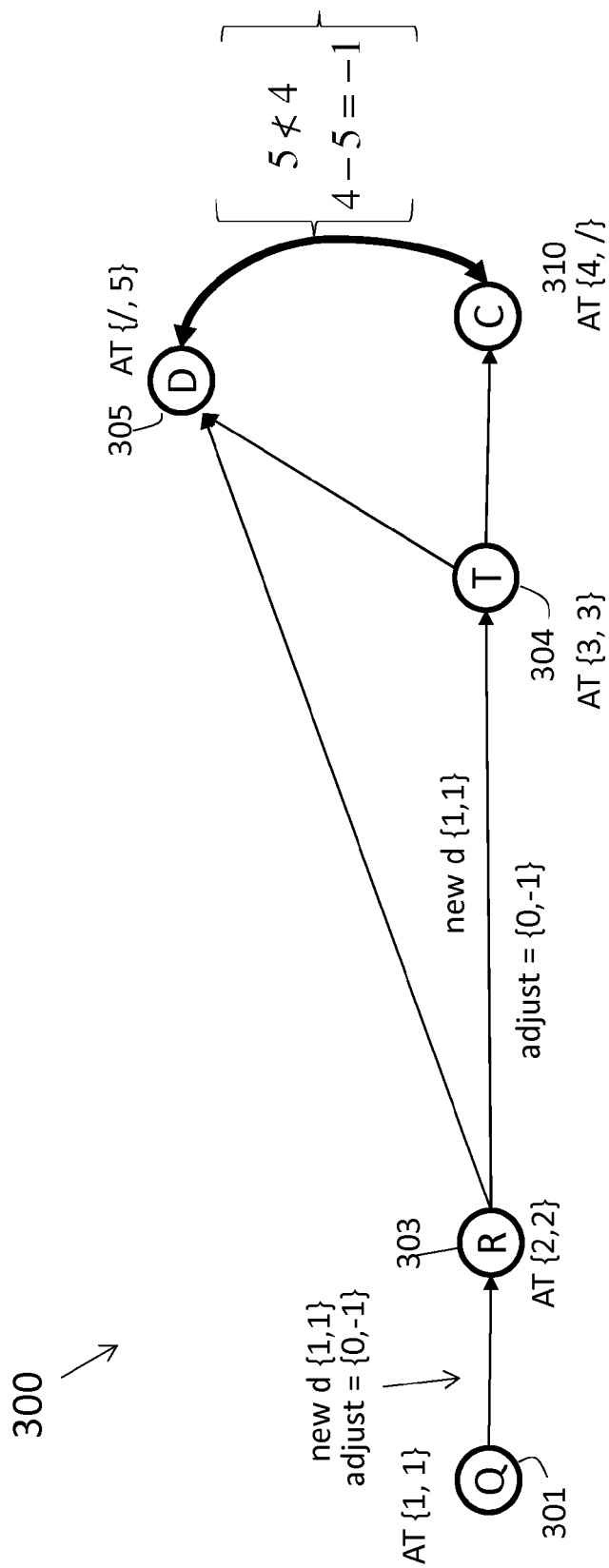

FIGS. 3-5 illustrate processes 210, 220, and 240 shown in FIG. 2 for an exemplary TSGR 300 according to an embodiment. The exemplary TSGR 300 shown in FIGS. 3-5 is a simplified example with a single path (Q 310→R 303→T 304→C 310) to the clock node C 310 for explanatory purposes. According to one embodiment, the processes shown in FIGS. 3-5 pertain only to the case when the path shown to the clock node 310 is the only path to the clock node 310. When there are additional paths to the clock node 310, the processes shown in FIGS. 6-9 may be used instead such that the multiple paths to the clock node 310 are processed simultaneously, according to the embodiment. According to an alternate embodiment, even when there are multiple paths to the clock node 310, those paths are processed individually (according to the processes shown in FIGS. 3-5) and may be processed in parallel.

FIG. 3 depicts the exemplary TSGR 300 according to block 210 (FIG. 2). FIG. 3 relates to a setup test, which is discussed for explanatory purposes and is not intended to limit the application of the processes discussed herein to one particular timing analysis test. The exemplary TSGR 300 includes five nodes Q 301, R 303, T 304, data node D 305, clock node C 310 that are interconnected, as shown, by edges 302. As FIG. 3 shows and as noted above, the setup test involves a comparison of the late mode arrival time (AT) of input to the data node D 305 with early mode AT of input to the clock node C 310. The arrival time at the source node Q 301 is indicated as $\{1,1\}$. That is, both the early mode and late mode arrival times for node Q 301 are 1 picosecond (ps) exemplary arrival times. For simplicity, the exemplary delay d through each of the edges 302 is assumed, as indicated, to be $\{1,2\}$. That is, the early mode delay is 1 ps, and the late mode delay is 2 ps. In order to obtain the arrival times at the data node D 305 and at the clock node C 310 to conduct the setup test, the arrival time indicated at the source node Q 301 must be propagated forward using the delay times through the edges 302. That is, the arrival time at node R 303 is a sum of the arrival time at the source node Q 301 and the delay through the edge 302 that interconnects the source node Q 301 with the node R 303. Thus, the arrival time at the node R 303 is $\{2,3\}$. However, every early mode and late mode arrival time at every node is not needed. This is because only the late mode arrival time at the data node D 305 and only the early mode arrival time at the clock node C 310 is needed. A request for the data necessary to obtain the late mode arrival time at the data node D 305 and the early mode arrival time at the clock node C 310 is indicated by value needed flags, as discussed with reference to FIG. 4.

FIG. 4 illustrates the process of back propagating value needed flags and obtaining arrival times according to block 220 (FIG. 2). Both the value needed flags and the resulting values (arrival time or delay) determined accordingly are shown in FIG. 4. Starting at the data node D 305, the only the late mode delay is needed through the edge 302 between node R 303 and the data node D 305. Accordingly, the value needed flags for the edge 302 from node R 303 to data node D 305 are VN [R,D]=$\{0,1\}$. The corresponding delay value provided is $\{/,2\}$. Although the notation $\{/,2\}$ is used to indicate that the early mode delay for the edge 302 is not requested and the early mode arrival time at the data node D 305 is not needed for the test, an early mode arrival time may be available at the data node D 305 based on an initial timing analysis. As noted above, for simplicity and explanatory purposes, the delay through every edge 302 shown for the TSGR 300 is given as $\{1,2\}$, and only the late mode delay is needed to compute the arrival time at the data node D 305. At the node R 303, both the early mode and the late mode arrival times are needed, because node R 303 is common to both the path from the source node Q 301 to the data node D 305 and the path from the source node Q 301 to the clock node C 310. The resulting arrival time at node R 303 (based on the arrival time $\{1,1\}$ at source node Q 301 and the delay through the edge 302 connecting them of $\{1,2\}$) is $\{2,3\}$, as shown. The late mode arrival time at data node D 305 based on the arrival time at node R 303 and the delay through the edge 302 between nodes R 303 and data node D 305 ($\{2,3\}+\{/,2\}$) is $\{/,5\}$.

However, the path Q 301→R 303→D 305 is not the only path from the source node Q 301 to the data node D 305. Another path is Q 301→R 303→T 304→D 305. Thus, starting again at the data node D 305, the late mode delay through the edge 302 between node T 304 and data node D 305 is needed as indicated by value needed flags VN [T,D]=$\{0,1\}$. Again, the corresponding late mode delay value is $\{/,2\}$, because, in this particular example, the delay of every edge 302 is given as $\{1,2\}$. At node T 304, like node R 303, both the early mode and the late mode arrival times are needed because node T 304 is common to both the path from the source node Q 301 to the data node D 305 and the path from the source node Q 301 to the clock node C 310. The resulting arrival time at node T 304 is a sum of the arrival time at the node R 303 and the delay through the edge 302 between R 303 and T 304 ({2,3}+{1,2}={3,5}), as shown. The late mode arrival time at the node D 305 based on the arrival time at node T 304 and the delay through the edge 302 between nodes T 304 and data node D 305 ({3,5}+{/,2}) is {/,7}. Because the test being performed in the example is a setup test, the latest late mode arrival time at the data node D 305 is of interest. Accordingly, between the late mode arrival time at the data node D 305 of {/,5}, which is determined for the path Q 301→R 303→D 305, and the late mode arrival time at the data node D 305 of {/,7}, which is determined for the path Q 301→R 303→T 304→D 305, the later late mode arrival time ({/,7}) is of interest, as indicated in FIG. 4.

Starting at the clock node C 301, only the early mode delay through the edge 302 between node T 304 and the clock node C 310 is of interest in the exemplary context of the setup test. Thus, as indicated, the value needed flags for that edge are VN [T,C]={1,0}, and the resulting delay provided is {1,/}. Accordingly, the early mode arrival time at the clock node C 310 is given by the sum of the arrival time at the node T 304 and the early mode delay through the edge 302 connecting node T 304 to the clock node C 310 ({3,5}+{1,/}) or {4,/}. As detailed above, the latest late mode arrival time at the data node D 305 is 7 ps, and the early mode arrival time at the clock node C 310 is 4 ps. The resulting test slack (computed at block 225) is −3 (4-7). Thus, the setup test fails in this case. However, CPP plays a part in the result of the setup test. As FIG. 4 indicates, both the edge 302 between node Q 301 and node R 303 and the edge 302 between node R 303 and node T 304 is associated with value needed flags of {1,1}, meaning that both the early mode delay and the late mode delay are needed. This is because both of these edges 302 are common to the path to the data node D 305 and the path to the clock node C 310. The fact that edges 302 from Q 301 to R 303 and R 303 to T 304 are both common to the paths to the data node D 305 and the clock node C 310 means that CPP results from considering early mode delay in those edges 302 for the purposes of determining early mode arrival time at the clock node C 310 and late mode delay in those same edges 302 for the purpose of determining late mode arrival time at the data node D 305.

FIG. 5 illustrates the process of adjusting delay according to block 240 (FIG. 2) and re-computing test slack according to block 250 to account for CPP in the test slack computed with reference to FIG. 4. The adjustment value (reduction in late mode delay) is based on the difference between the early mode and late mode delay along a common edge 302 (common to the data node D 305 and the clock node C 310). In the exemplary case, every edge 302 has a delay of {1,2}. Thus, the adjustment (1-2) is −1, as indicated in FIG. 5. As FIG. 5 indicates, the late mode delay of the two edges 302 that are common for determining late mode arrival time at the data node D 305 and early mode arrival time at the clock node C 310 is adjusted (reduced by 1). Thus, rather than the original delay of {1,2} for those edges 302, a delay of {1,1} is used. The resulting test slack is determined according to block 240. That is, new late mode arrival times at node R 303 and T 304 are determined using the new delay values, and late mode arrival time at data node D 305 is determined using the late mode arrival time at node T 304 and the (unchanged) delay through the edge 302 between node T 304 and the data node D 305. As FIG. 5 indicates, this new late mode arrival time at data node D 305 is 5 ps. This late mode arrival time at data node D 305 is still greater than the early mode arrival time (4 ps) at the clock node C 310. However, based on the adjusted delays through the common edges 302, the difference between the late mode arrival time at the data node D 305 and the early mode arrival time at the clock node C 310 is less (−1) than it was prior to the delay adjustment (−3). The worst-case complexity of the approach described above is linear (i.e., in the worst case, every edge 302 within the TSGR 300 is incrementally re-evaluated to compute a new arrival time once at most). As noted above, the example shown in FIGS. 3-5 is simplified because it is a non-convergent clock case (there is only one path from the source node Q 301 to the clock node C 310). A more complex example illustrating the multi clock path case (clock reconvergence) is below.

Figure 6:
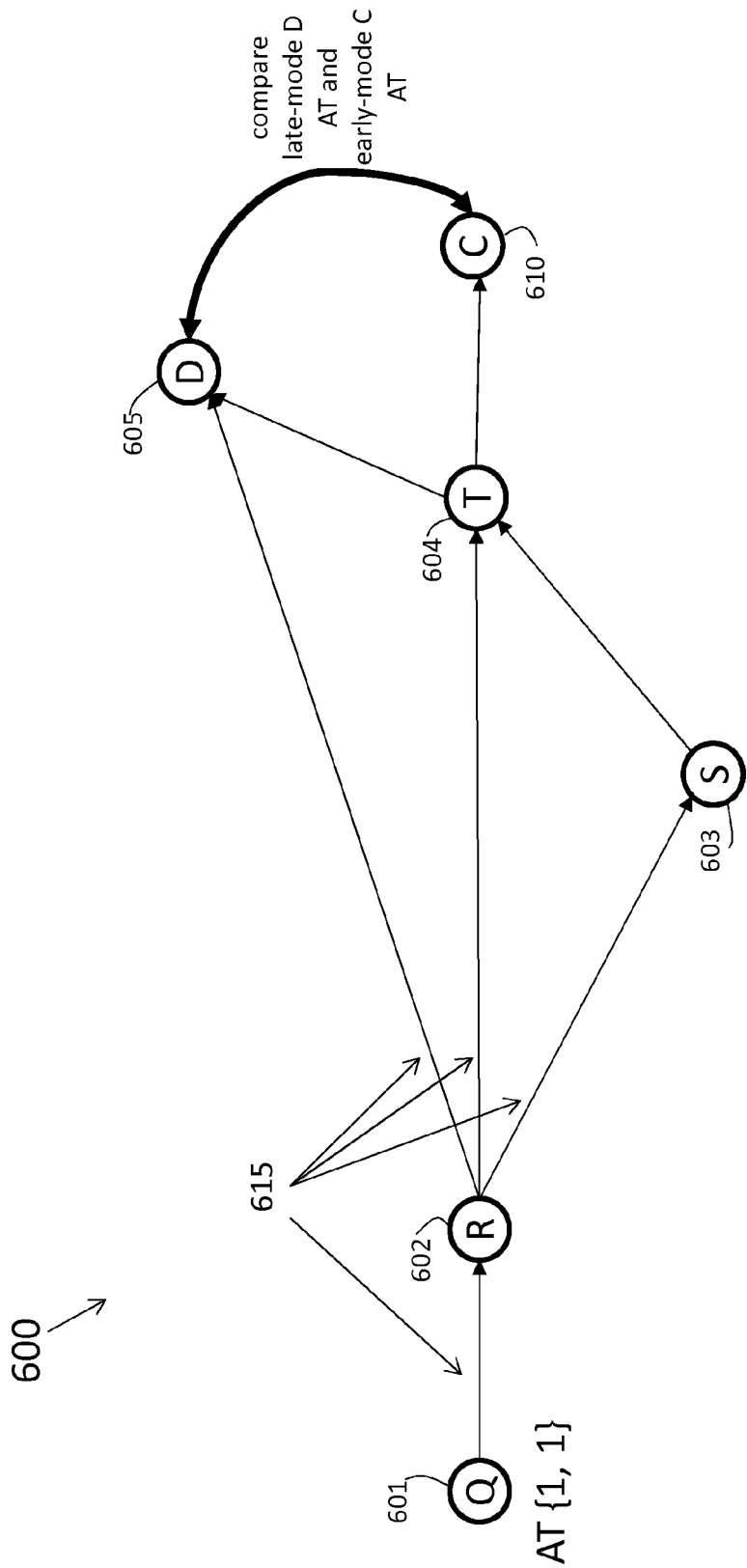
Figure 7:
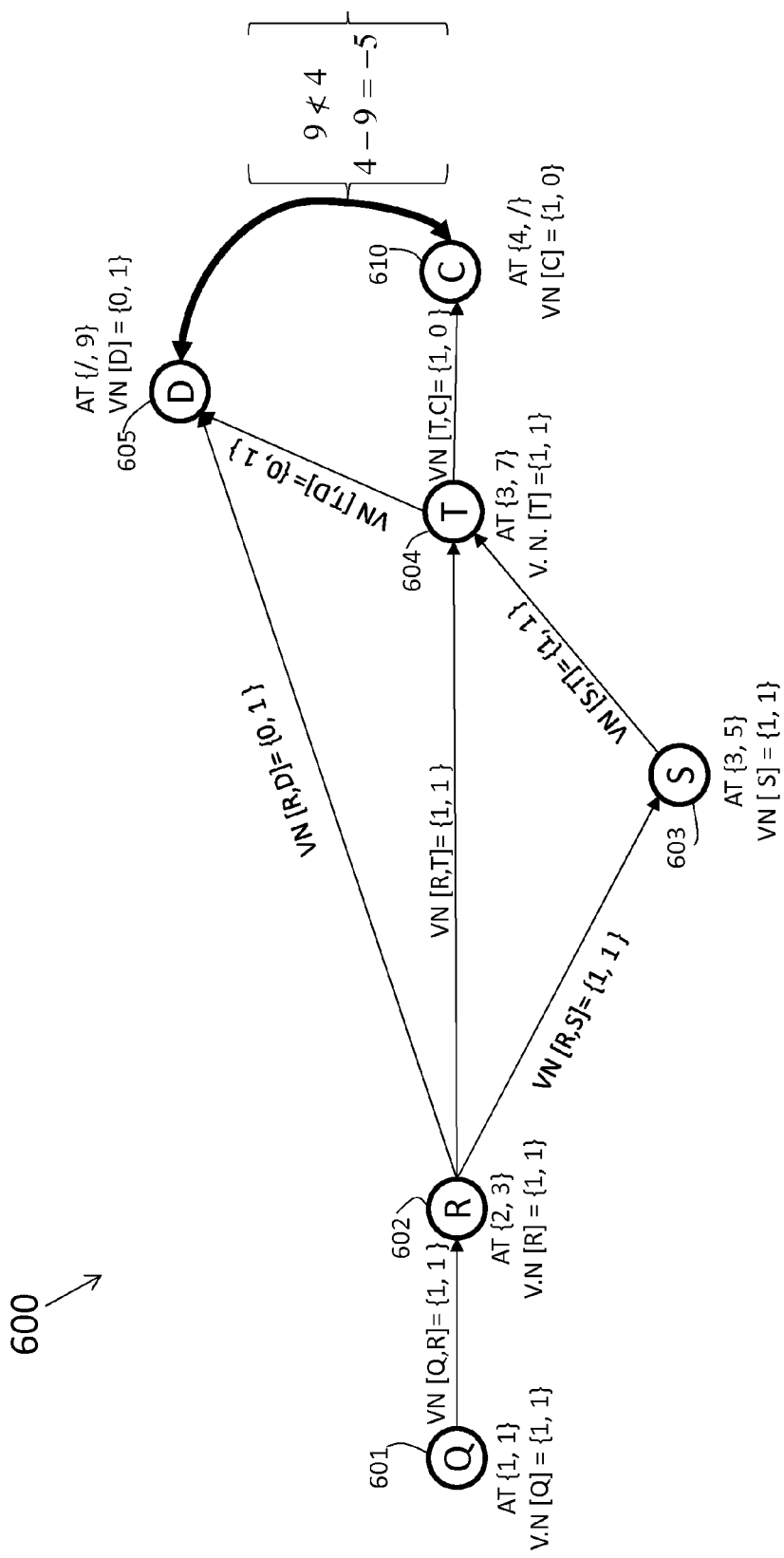

FIG. 6-9 illustrate processes 210 through 240 shown in FIG. 2 for another exemplary TSGR 600 according to another embodiment. FIG. 6 depicts the exemplary TSGR 600 according to block 210 (FIG. 2). FIG. 6 also relates to a setup test, but, as noted above, the embodiments described herein are not limited to any particular timing analysis test. The exemplary TSGR 600 shown in FIGS. 6-9 includes two different paths (Q 601→R 602→S 603→T 604→C 610 and Q 601→R 602→T 604→C 610) to the clock node C 610. The exemplary TSGR 600 includes six nodes Q 601, R 602, S 603, T 604, data node D 605, clock node C 610 that are interconnected, as shown, by edges 615. The setup test involves a comparison of the last mode arrival time of input to the data node D 605 with early mode arrival time of input to the clock node C 610. In the exemplary TSGR 600 shown in FIG. 6, there are three paths the data node D 605 (Q 601→R 602→S 603→T 604→D 605, Q 601→R 602→T 604→D 605, and Q 601→R 602→D 605) and two paths to the clock node C 610. Thus, the earlier among the two arrival times at the clock node C 610 is compared with the latest among the three arrival times at the data node D 605. The arrival time at the source node Q 601 is indicated as {1,1}. The delay through every edge 615 is once again given as {1,2} for explanatory purposes. As discussed above, with reference to FIG. 3, the arrival time at the source node Q 601 is propagated forward to determine the last mode arrival time (via each path) at the data node D 605 and the early mode arrival time (via each path) at the clock node C 610. Thus, for example, the arrival time at the node R 602 is the sum of the arrival time at node Q 601 and the delay through the edge 615 connecting node Q 601 and node R 602 ({1,1}+{1,2}) or {2,3}. Again, not every early mode and late mode value is necessarily needed at each node and edge. Thus, the requests for the data necessary to obtain the late mode arrival time at the data node D 605 and the early mode arrival time at the clock node C 610 are shown in FIG. 7.

FIG. 7 illustrates the process of back propagating value needed flags and obtaining arrival times according to block 220 (FIG. 2). As FIG. 7 indicates, only the late mode delay is needed for the edges between node R 602 and the data node D 605 and between node T 604 and the data node D 605, and only the early mode delay is needed for the edge 615 between node T 604 and the clock node C 610 (VN [R,D] and VN [T,D] are {0,1}, and VN [T,C] is {1,0}). However, all the nodes (Q 601, R 602, S 603, T 604) are common to at least one path to the data node D 605 and at least one path to the clock node C 610. Thus, both the early mode and the late mode arrival time is needed at each of the nodes (Q 601, R 602, S 603, T 604). The test slack (computed at block 225) resulting from the arrival times propagated from the arrival time at the node Q 601 is shown as −5 (4-9). This negative test slack means that the setup test failed. However, the CPP contributing the failing test slack may be addressed as further detailed below. According to the current embodiment, because multiple paths lead from the source node Q 601 to the clock node C 610, timing tags are used as detailed with reference to FIG. 8.

Figure 8:
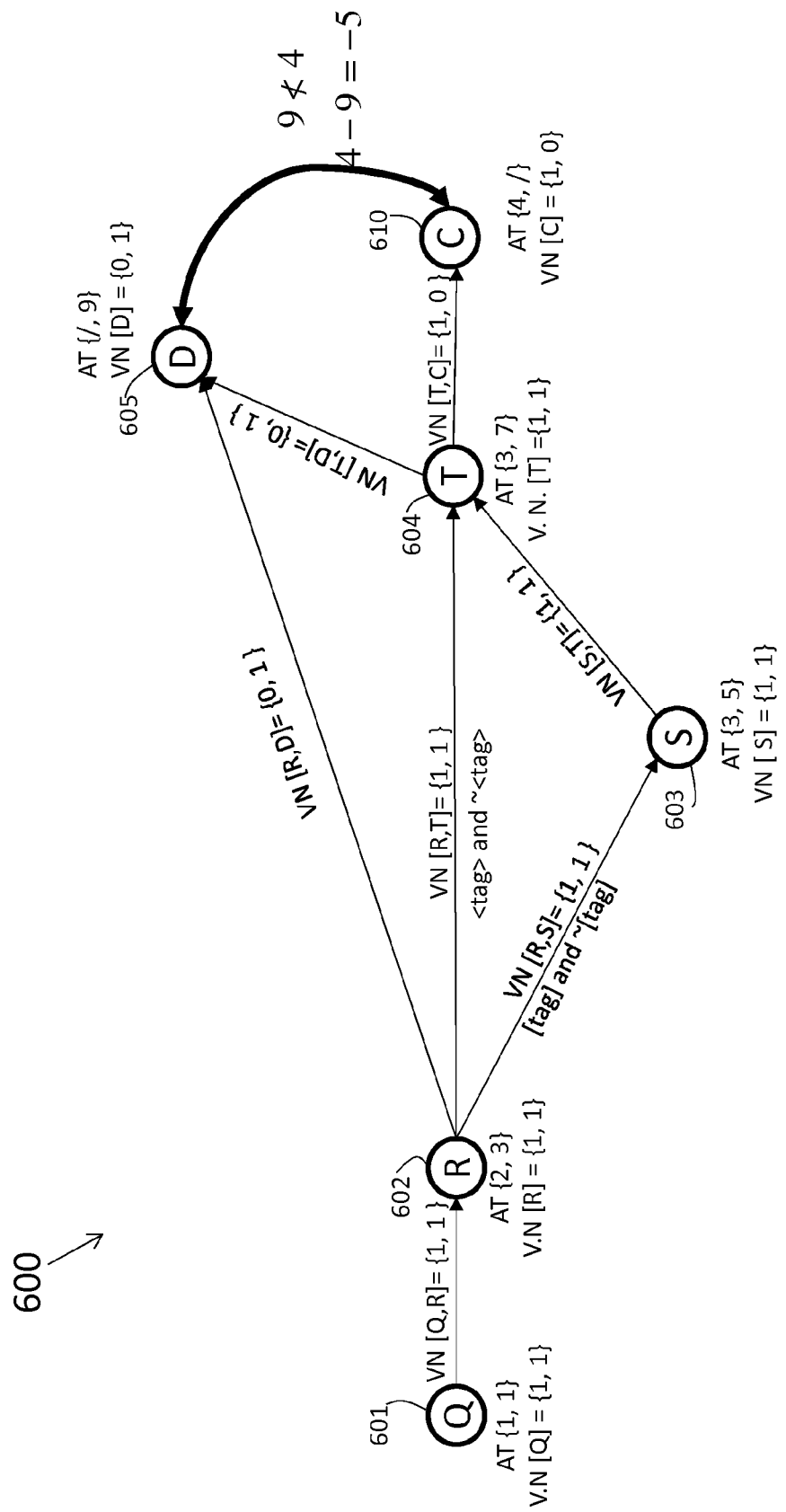

FIG. 8 illustrates the process of inserting tags, according to block 230 (FIG. 2), for the exemplary TSGR 600. Beginning at the fan-out leading to the multiple paths to the clock node C 610 (to clock reconvergence), each outgoing edge with value needed flags VN of {1,1} is given a unique tag and a compliment tag. For the exemplary TSGR 600, the fan-out is at node R 602, and the outgoing edges 615 with VN of {1,1} are the edge 615 between nodes R 602 and T 604 and the edge 615 between nodes R 602 and S 603. The edge 615 between nodes R 602 and T 604 is given a tag and complementary tag indicated by < > and ~< >, respectively. The edge 615 between nodes R 602 and T 604 is given a tag and complementary tag indicated by [ ] and ~[ ], respectively.

Figure 9:
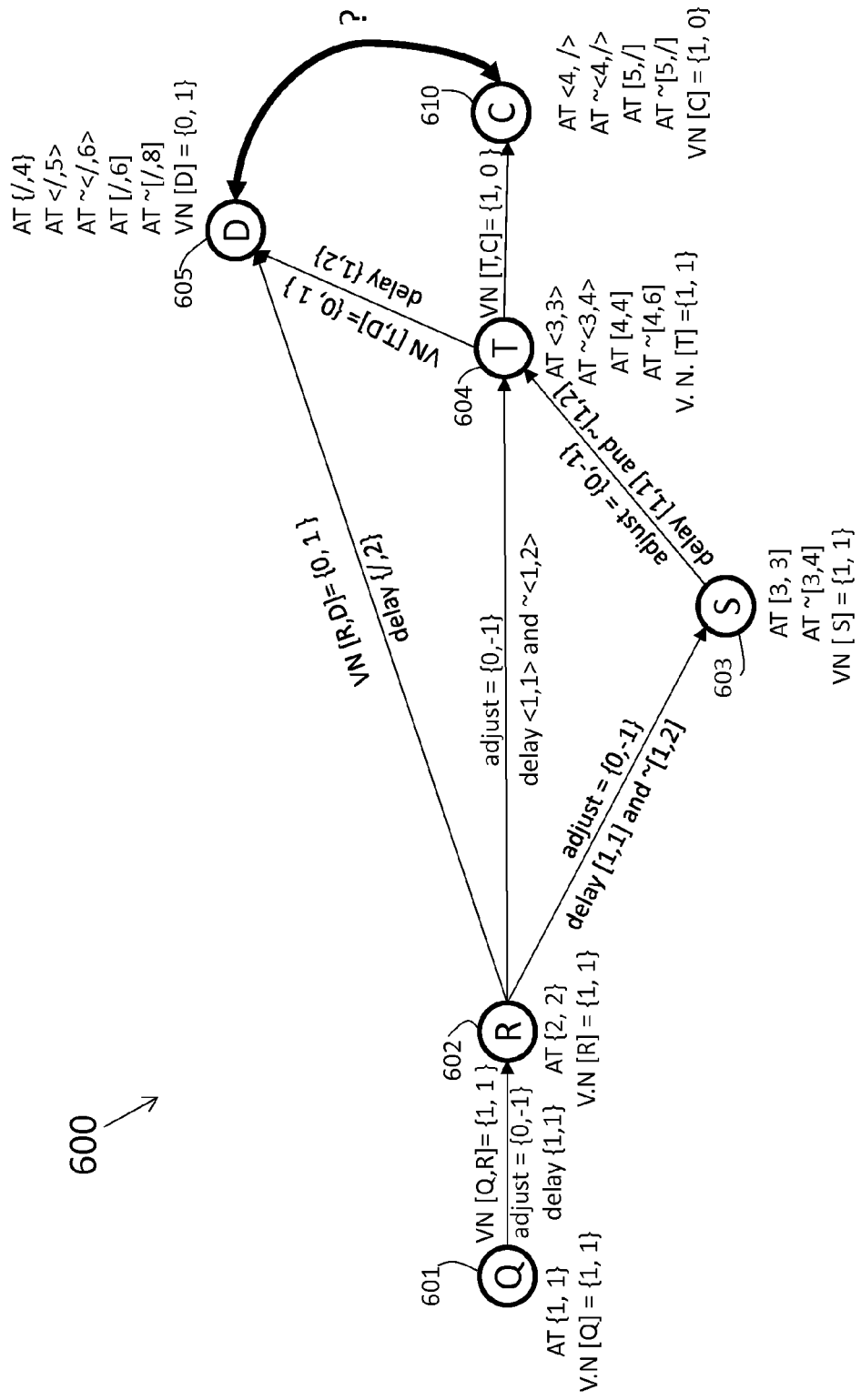

FIG. 9 illustrates the process of adjusting delay according to block 240 (FIG. 2) and re-computing test slack according to block 250. Adjusted delay is only applied to the non-complementary tags, as indicated by FIG. 9. As noted with reference to FIG. 5, the adjustment value is the difference between early mode and late mode delay of edges 615 common to the paths to the data node D 605 and clock node C 601. Because the delay through every edge 615 is {1,2} in the exemplary TSGR 600, the adjustment applied to the non-complementary tags in each of the common paths is {0,−1} (difference 1-2=−1). Specifically, the adjustment is applied to the edge 615 between nodes R 602 and T 604, the edge 615 between nodes R 602 and S 603, and the edge 615 between nodes S 603 and T 604. The arrival times resulting from the delay adjustments are shown using the tags to indicate which arrival times are affected by the adjusted delays and which arrival times are unaffected. As noted above, {/,late mode value} is indicated at the data node D 605, and {early mode value,/} is indicated at the clock node 610 to emphasize that the early mode arrival time at the clock node C 610 and the late mode arrival time at the data node D 605 are the only value of interest (with regard to the exemplary startup test). As FIG. 9 shows, five late mode arrival time values are available at the data node D 605 and four early mode arrival times are available at the clock node C 610. Thus, as indicated by the question mark in FIG. 9, determining which early mode arrival time at the clock node C 610 and which late mode arrival time at the data node D 605 to use in the exemplary setup test is not straightforward. Table 1, below, indicates the different combinations of arrival times at the data node D 605 and the clock node C 610 that may be compared as part of the exemplary setup test.

TABLE 1

Combinations of delays to determine arrival times at the data node and the clock node.

| scenario | Data node arrival time | Clock node arrival time | note |
|---|---|---|---|
| 1 | tag (adjusted delay) | same tag | both clock and data signals took the same common path at a given fan-out node—adjusted |

TABLE 1-continued

Combinations of delays to determine arrival times at the data node and the clock node.

| scenario | Data node arrival time | Clock node arrival time | note |
|---|---|---|---|
|  |  |  | delay through that path is valid |
| 2 | ~tag (unadjusted delay) | any other tag | the same common path was not used to reach both the data node and the clock node |
| 3 | no tag | any value | adjusted delay is guaranteed to apply to path segments that are always common between the clock path and the data path |
| 4 | ~tag (unadjusted delay) | non-complement version of same tag | the same tag means that the same common path was used to reach the data node and the clock node, but the data path delay is not adjusted—this is overly pessimistic |

Table 2, below, shows the arrival times that would result for the exemplary TSGR 600 shown in FIG. 9 according to the scenarios shown in Table 1.

TABLE 2

Arrival times for TSGR 600 according to different scenarios.

| late mode data AT | early mode clock AT | slack | scenario |
|---|---|---|---|
| 4 (no tag) | 4 (< > tag) | 0 | 3 |
| 4 (no tag) | 5 ([ ] tag) | −1 | 3 |
| 5 (< > tag) | 4 (< > tag) | −2 | 1 |
| 5 (< >) tag | 5 ([ ] tag) | not computed | 4 |
| 6 (~< >tag) | 4 (< > tag) | not computed | 4 |
| 6 (~< >tag) | 5 ([ ] tag) | −1 | 2 |
| 6 ([ ] tag) | 4 (< > tag) | not computed | 4 |
| 6 ([ [ tag) | 5 ([ ] tag) | −1 | 1 |
| 8 (~[ ] tag) | 4 (< > tag) | −4 | 2 |
| 8 (~[ ] tag) | 5 ([ ] tag) | not computed | 4 |

As Table 2 indicates, six valid slack values are computed. The worst slack value determined by the combinations shown in Table 2 is −4. As noted in the discussion of FIG. 8, the pre-CPPR test slack is −5. Thus, the adjustment (post-CPPR test slack (−4)—pre-CPPR test slack (−5)) is +1. This means that the setup test for exemplary TSGR 600 has improved by a slack value of +1 even in the worst case based on CPPR.

Figure 10:
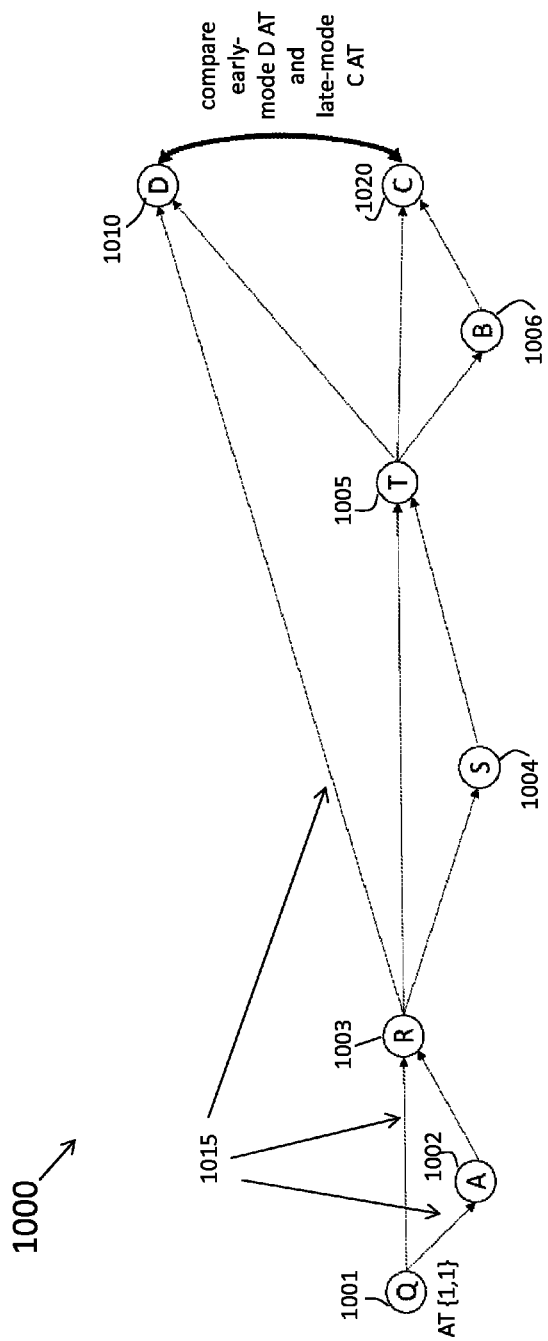
Figure 11:
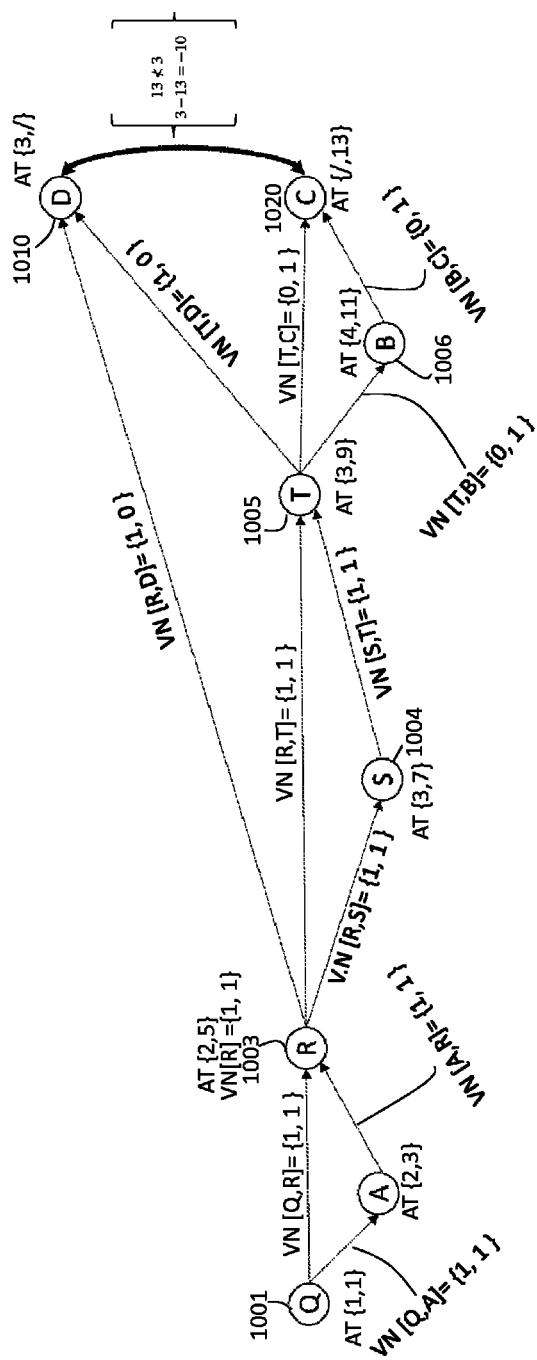
Figure 12:
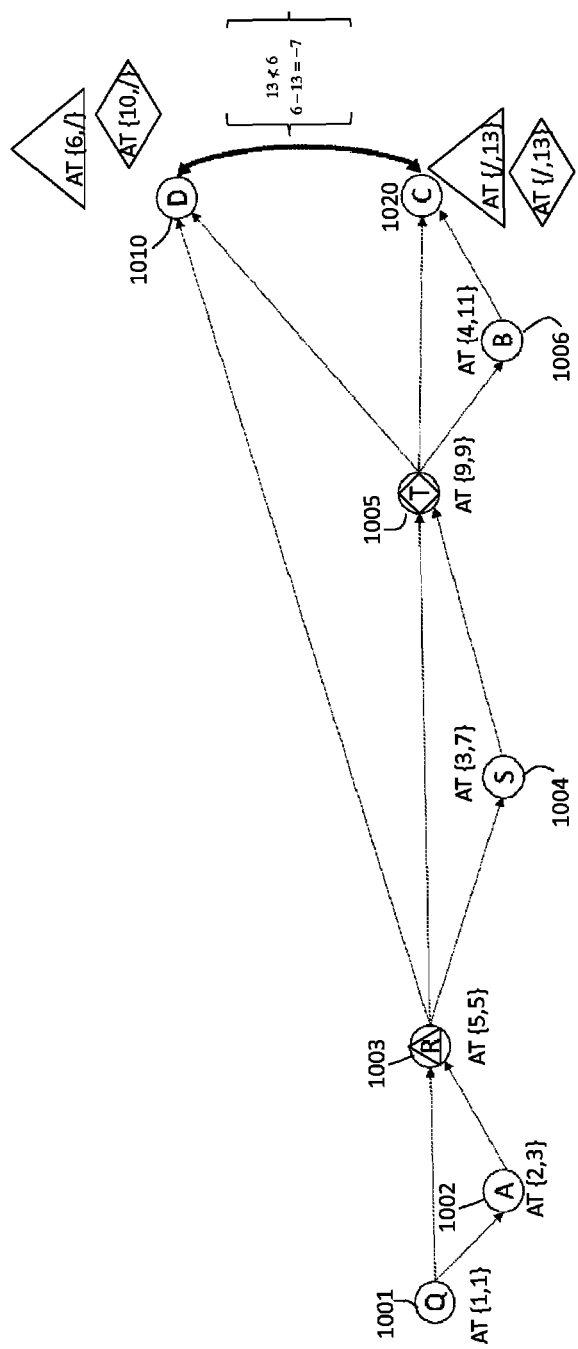

FIG. 10-12 illustrate processes 210 through 240 shown in FIG. 2 for another exemplary TSGR 1000 according to another embodiment. FIG. 10 depicts the exemplary TSGR 1000 according to block 210 (FIG. 2). The exemplary test performed on the TSGR 1000 is a hold test which determines whether the late mode arrival time at the clock node C 1020 is before the early mode arrival time at the data node D 1010. The exemplary TSGR 1000 includes eight nodes Q 1001, A 1002, R 1003, S 1004, T 1005, B 1006, the data node D 1010, and the clock node C 1020 that are interconnected by edges 1015 as shown in FIG. 10. For simplicity, the delay through every edge 1015 in the TSGR 1000 is assumed to be {1,2}. In the exemplary TSGR 1000, the first divergence at node Q 1001 (paths Q 1001→R 1003 and Q 1001→A 1002→R1003) affects the arrival time at both the data node D 1010 and the clock node C 1020 in the same way. The second divergence at node R 1003 (paths R→1003S→1004→T 1005 and R 1003→T 1005) also affects arrival time at both the data node D 1010 and the clock node C 1020. The third divergence at node T 1005 (paths T→1005→C 1020 and T 1005→B 1006→C 1020) affects only the arrival time at the clock node C 1020.

FIG. 11 illustrates the process of back propagating value needed (VN) flags and obtaining arrival times according to block 220 (FIG. 2). As FIG. 11 indicates, only the early mode delay is needed for the edge 1015 between node R 1003 and the data node D 1010 and the edge 1015 between node T 1005 and the data node D 1010 (value needed flags VN [R,D]={1,0} and VN [T,D]={1,0}), and only the late mode delay is needed for the edge 1015 between node T 1005 and the clock node C 1020 (value needed flags VN [T,C]={0,1}). All other edges 1015 are common to both the data and clock paths and, thus, both the early mode and the late mode delays are needed through those edges 1015, as indicated by the respective VN in FIG. 11. Arrival times indicated by the value needed flags are indicated in FIG. 11. At node R 1003, for example, the arrival time is indicated as {2,5}. This arrival time represents the earliest early mode arrival time and the latest late mode arrival time. That is, based on the edge 1015 between node Q 1001 and node R 1003 and the associated delay of {1,2}, the arrival time at node R 1003 is {2,3} ({1,1}+{1,2}), and based on the edge 1015 between node A 1002 and node R 1003, the arrival time at node R 1003 is {3,5} ({2,3}+{1,2}). Given the arrival times {2,3} and {3,5}, the earliest early mode arrival time and the latest late mode arrival time are {2,5}. This arrival time is propagated forward to the data node D 1010 and the clock node C 1020 as the worst case. As FIG. 11 shows, the test slack (computed at block 225 based on the arrival times) is −10 (3-13). This negative test slack indicates that the hold test has failed, but, because of the CPP that contributes to the failing test slack, CPPR may be performed as detailed below. Because of the multiple paths to the clock node C 1020, tags (according to the process at block 230) are used. However, unlike the timing tags discussed with reference to FIG. 8, the present embodiment relates to frontier tags as detailed below.

FIG. 12 illustrates the process of inserting tags, according to block 230 (FIG. 2), as well as adjusting delay and re-determining slack (blocks 240 and 250), for the exemplary TSGR 1000. Each frontier point is marked. The frontier points are nodes with VN set to {1,1} that seed a path a segment with VN set to {1,0}. The frontier points in the exemplary TSGR 1000 are node R 1003 (marked by a triangle) and node T 1005 (marked by a diamond). Node R 1003 is associated with value needed flags VN[R]={1,1} but seeds the edge 1015 to data node D 1010, which is associated with value needed flags VN[R,D]={1,0}. Node T 1005 is associated with value needed flags VN[T]={1,1} but seeds the edge to data node D 1010, which is associated with value needed flags VN[T,D]={1,0}. As FIG. 12 indicates, the late mode arrival time at the frontier points is adopted as the early mode arrival time. This is because, for an early mode test (or, more generally, for a same-cycle test), the data and clock transitions in question occur during the same clock cycle, and therefore must occur at the same fixed point in time. Consequently, the arrival time at node R 1003 shown in FIG. 11 ({2,5}) is set to {5,5} in FIG. 12, and the arrival time at node T 1005 shown in FIG. 11 ({3,9}) is set to {9,9} in FIG. 12. The early mode arrival times resulting at the data node D 1010 and the late mode arrival times resulting at the clock node C 1020 are shown. At the data node D 1010, the arrival time in a triangle represents the arrival time resulting from the path directly from node R 1003, and the arrival time in a diamond represents the arrival time resulting from the path directly from node T 1005. At the clock node C 1020, both the arrival time in a triangle and the arrival time in a diamond are the same, because there is no separate path to the clock node C 1020 directly from the node R 1003. Thus, instead, the latest of the late mode arrival times resulting from T 1005→B 1006→C 1020 and T 1005→C 1020 is used. No untagged arrival times are available at either the data node D 1010 or the clock node C 1020 based on the arrangement of the exemplary TSGR 1000. However, if, for example, a path were available that bypassed all frontier points (e.g., a path from Q 1001→D 1010), that path would generate an untagged arrival time at the data node D 1010. If there were an untagged arrival time at the data node D 1010, that (early mode) arrival time could be compared with all (tagged and untagged) late mode arrival times at the clock node C 1020. The tagged arrival times at the data node D 1010 are compared with the same-tagged arrival time at the clock node C 1020. The worst slack value resulting from the comparisons is reported as the post-CPPR slack. In the absence of any untagged arrival times for the exemplary TSGR 1000, the applicable comparisons are shown in Table 3 below.

TABLE 3

Exemplary comparisons of early mode data and late mode clock arrival times.

| early mode data AT | late mode clock AT | slack | notes |
|---|---|---|---|
|  |  |  | same tag |
|  |  | not computed | not same tag |
|  |  | not computed | not same tag |
|  |  | −3 | same tag |

As FIG. 12 indicates, the worst slack is −7. This is reported as the post-CPPR slack for the exemplary hold test. Comparing the slack discussed with reference to FIG. 11 (−10), prior to any adjustment based on the tags, the improvement in slack is +3 (−10 to −7).

The embodiments discussed above apply to statistical, multi-corner, or single-corner timing analysis. Statistical and multi-corner timing analysis refers to two different ways to account for the various chip and environmental conditions that contribute to variability in arrival times at a given point in the chip. The values of arrival time, delay, and slack may be scalar quantities, as discussed in the examples above, or, in alternate embodiments, may be statistical distributions or parameterized functions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer implemented method of performing parallel multi-threaded common path pessimism removal in integrated circuit design, the method comprising:
   constructing, using a processor, a thread-specific graphical representation (TSGR) relating to each data node and clock node pair, each TSGR including one or more paths from a source node to the data node, two or more paths from the source node to the clock node, additional nodes between the source node and the data node or the clock node, and edges that interconnect the source node or any of the additional nodes with the data node or the clock node or the source node or any of the additional nodes with each other;
   performing, using the processor, in parallel, for each TSGR:
      determining initial arrival times at the data node and the clock node;
      computing initial test slack based on the initial arrival times at the data node and the clock node;
      identifying fan-out nodes among the additional nodes, each fan-out node being an origin of at least two of the edges in the two or more paths to the clock node;
      generating one or more tags based the fan-out nodes;
      determining adjusted arrival times based on the one or more tags; and
      computing adjusted test slack based on the adjusted arrival times, wherein the adjusted test slack is used to validate or modify the integrated circuit design, wherein the integrated circuit design is provided for physical implementation.

2. The computer implemented method according to claim 1, wherein the determining the initial arrival times includes generating value needed flags indicating early mode or late mode arrival time and delay values needed in association with the source node, the clock node, the data node, the additional nodes, and the edges.

3. The computer implemented method according to claim 1, wherein the generating the one or more tags includes tagging each of the at least two of the edges with a respective edge tag and respective edge complementary tag.

4. The computer implemented method according to claim 3, wherein the determining the adjusted arrival times includes determining an adjusted delay for each of the at least two of the edges only with respect to the edge tag and propagating the initial arrival time of the source node using the adjusted delay for each of the at least two of the edges.

5. The computer implemented method according to claim 1, wherein the identifying the fan-out nodes additionally includes identifying the additional nodes that are an origin of at least one of the one or more paths to the data node.

6. The computer implemented method according to claim 5, wherein the generating the one or more tags includes tagging each of the fan-out nodes.

7. The computer implemented method according to claim 6, wherein the determining the adjusted arrival times includes propagating the initial arrival time of the source node and changing the initial arrival time of each of the fan-out nodes while traversing the one or more paths to the data node and the two or more paths to the clock node.

8. The computer implemented method according to claim 1, wherein, based on performing a setup test, the computing the initial test slack includes comparing an early mode of the initial arrival time of the clock node with a late mode of the initial arrival time of the data node, and, based on performing a hold test, the computing the initial test slack includes comparing an early mode of the initial arrival time of the data node with a late mode of the initial arrival time of the clock node.

9. A system to perform parallel multi-threaded common path pessimism removal in integrated circuit design, the system comprising:
   a memory device configured to store an initial arrival time at a source node; and
   a processor configured to, in parallel:
      construct a thread-specific graphical representation (TSGR) relating to each data node and clock node pair, each TSGR including one or more paths from the source node to the data node, two or more paths from the source node to the clock node, additional nodes between the source node and the data node or the clock node, and edges that interconnect the source node or any of the additional nodes with the data node or the clock node or the source node or any of the additional nodes with each other;
      determine initial arrival times at the data node and the clock node;
      compute initial test slack based on the initial arrival times at the data node and the clock node;
      identify fan-out nodes among the additional nodes, each fan-out node being an origin of at least two of the edges in the two or more paths to the clock node;
      generate one or more tags based the fan-out nodes;
      determine adjusted arrival times based on the one or more tags; and compute adjusted test slack based on the adjusted arrival times, wherein the integrated circuit design is provided for physical implementation.

10. The system according to claim 9, wherein the processor generates value needed flags indicating early mode or late mode arrival time and delay values needed in association with the source node, the clock node, the data node, the additional nodes, and the edges.

11. The system according to claim 9, wherein the processor tags each of the at least two of the edges with a respective edge tag and respective edge complementary tag.

12. The system according to claim 11, wherein the processor determines the adjusted arrival times by determining an adjusted delay for each of the at least two of the edges only with respect to the edge tag and propagating the initial arrival time of the source node using the adjusted delay for each of the at least two of the edges.

13. The system according to claim 9, wherein the processor additionally identifies the additional nodes that are an origin of at least one of the one or more paths to the data node to identify the fan-out nodes and tags each of the fan-out nodes.

14. The system according to claim 13, wherein the processor determines the adjusted arrival times based on propagating the initial arrival time of the source node and changing the initial arrival time of each of the fan-out nodes while traversing the one or more paths to the data node and the two or more paths to the clock node.

15. The system according to claim 9, wherein, based on performing a setup test, the processor computes the initial test slack by comparing an early mode of the initial arrival time of the clock node with a late mode of the initial arrival time of the data node, and, based on performing a hold test, the processor computes the initial test slack by comparing an early mode of the initial arrival time of the data node with a late mode of the initial arrival time of the clock node.

16. A computer program product for performing parallel multi-threaded common path pessimism removal in integrated circuit design, the computer program product comprising a computer readable storage medium having program instructions embodied therewith, the program instructions executable by a processor to perform a method comprising:
    constructing a thread-specific graphical representation (TSGR) relating to each data node and clock node pair, each TSGR including one or more paths from a source node to the data node, two or more paths from the source node to the clock node, additional nodes between the source node and the data node or the clock node, and edges that interconnect the source node or any of the additional nodes with the data node or the clock node or the source node or any of the additional nodes with each other;
    performing in parallel, for each TSGR:
        determining initial arrival times at the data node and the clock node;
        computing initial test slack based on the initial arrival times at the data node and the clock node;
        identifying fan-out nodes among the additional nodes, each fan-out node being an origin of at least two of the edges in the two or more paths to the clock node;
        generating one or more tags based the fan-out nodes;
        determining adjusted arrival times based on the one or more tags; and
        computing adjusted test slack based on the adjusted arrival times, wherein the integrated circuit design is provided for physical implementation.

17. The computer program product according to claim 16, wherein the determining the initial arrival times includes generating value needed flags indicating early mode or late mode arrival time and delay values needed in association with the source node, the clock node, the data node, the additional nodes, and the edges.

18. The computer program product according to claim 16, wherein the generating the one or more tags includes tagging each of the at least two of the edges with a respective edge tag and respective edge complementary tag, and the determining the adjusted arrival times includes determining an adjusted delay for each of the at least two of the edges only with respect to the edge tag and propagating the initial arrival time of the source node using the adjusted delay for each of the at least two of the edges.

19. The computer program product according to claim 16, wherein the identifying the fan-out nodes additionally includes identifying the additional nodes that are an origin of at least one of the one or more paths to the data node, the generating the one or more tags includes tagging each of the fan-out nodes, and the determining the adjusted arrival times includes propagating the initial arrival time of the source node and changing the initial arrival time of each of the fan-out nodes while traversing the one or more paths to the data node and the two or more paths to the clock node.

20. The computer program product according to claim 16, wherein, based on performing a setup test, the computing the initial test slack includes comparing an early mode of the initial arrival time of the clock node with a late mode of the initial arrival time of the data node, and, based on performing a hold test, the computing the initial test slack includes comparing an early mode of the initial arrival time of the data node with a late mode of the initial arrival time of the clock node.

* * * * *